United States Patent
Ju

(10) Patent No.: US 11,469,279 B2
(45) Date of Patent: Oct. 11, 2022

(54) DISPLAY DEVICE

(71) Applicant: Samsung Display Co., Ltd., Yongin-si (KR)

(72) Inventor: Jinho Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/142,074

(22) Filed: Jan. 5, 2021

(65) Prior Publication Data

US 2021/0126064 A1   Apr. 29, 2021

Related U.S. Application Data

(63) Continuation of application No. 16/215,462, filed on Dec. 10, 2018, now Pat. No. 10,923,541.

(30) Foreign Application Priority Data

Jan. 30, 2018  (KR) .......................... 10-2018-0011360

(51) Int. Cl.
*H01L 27/32* (2006.01)
*H01L 51/52* (2006.01)
(Continued)

(52) U.S. Cl.
CPC ...... *H01L 27/3234* (2013.01); *G06V 40/1318* (2022.01); *H01L 27/323* (2013.01);
(Continued)

(58) Field of Classification Search
CPC .......................... H01L 27/3234; H01L 27/323; H01L 51/5284
See application file for complete search history.

(56) References Cited

U.S. PATENT DOCUMENTS

| 8,866,170 B2 | 10/2014 | Moon et al. |
| 9,653,520 B2 | 5/2017 | Kim et al. |

(Continued)

FOREIGN PATENT DOCUMENTS

| CN | 106886767 | 6/2017 |
| KR | 10-2012-0089950 | 8/2012 |

(Continued)

OTHER PUBLICATIONS

Non-Final Office Action dated Mar. 31, 2020, issued to U.S. Appl. No. 16/215,462.

(Continued)

*Primary Examiner* — Aaron J Gray
(74) *Attorney, Agent, or Firm* — H.C. Park & Associates, PLC

(57) ABSTRACT

A display device includes: a substrate on which a plurality of sub-pixels are arranged; a light-emitting device including a light-emitting layer in each of the plurality of sub-pixels; a thin film encapsulation layer covering the light-emitting layer in each of the plurality of sub-pixels; a black matrix around the plurality of sub-pixels; and an optical sensor on the substrate, the optical sensor including a sensing portion for sensing light emitted from a light source, wherein the black matrix has a plurality of openings, through which light emitted from the light source passes, in a path through which the light is received by the sensing portion via an input object which is in contact with the substrate.

8 Claims, 6 Drawing Sheets

(51) Int. Cl.
  *H01L 27/146* (2006.01)
  *G06V 40/13* (2022.01)
(52) U.S. Cl.
  CPC ...... *H01L 27/3244* (2013.01); *H01L 51/5253* (2013.01); *H01L 51/5281* (2013.01); *H01L 51/5284* (2013.01); *H01L 27/14678* (2013.01)

(56) References Cited

U.S. PATENT DOCUMENTS

| | | |
|---|---|---|
| 9,692,018 B2 | 6/2017 | Cho et al. |
| 10,664,680 B2 | 5/2020 | Xu et al. |
| 2016/0351631 A1 | 12/2016 | Lee |
| 2016/0364082 A1* | 12/2016 | Kimura ............... G02F 1/13439 |
| 2017/0054108 A1 | 2/2017 | Kim et al. |
| 2017/0161544 A1 | 6/2017 | Fomani et al. |
| 2017/0212613 A1 | 7/2017 | Hwang et al. |
| 2017/0346043 A1 | 11/2017 | Lee et al. |
| 2017/0372113 A1* | 12/2017 | Zhang ................. H01L 27/3244 |
| 2019/0026530 A1 | 1/2019 | Wu et al. |
| 2019/0050621 A1* | 2/2019 | Xu ..................... G06V 40/1318 |
| 2019/0213379 A1 | 7/2019 | Zhao et al. |
| 2019/0228204 A1 | 7/2019 | Park et al. |

FOREIGN PATENT DOCUMENTS

| | | |
|---|---|---|
| KR | 10-1407309 | 6/2014 |
| KR | 10-2016-0031108 | 3/2016 |
| KR | 10-2016-0095315 | 8/2016 |
| KR | 10-2016-0140089 | 11/2016 |
| KR | 10-2017-0087635 | 7/2017 |
| WO | 2018004243 | 1/2018 |

OTHER PUBLICATIONS

Notice of Allowance dated Oct. 21, 2020, issued to U.S. Appl. No. 16/215,462.

Notice of Allowance dated Dec. 10, 2020, issued to U.S. Appl. No. 16/215,462.

* cited by examiner

DISPLAY DEVICE

CROSS-REFERENCE TO RELATED APPLICATION

This application is a Continuation of U.S. patent application Ser. No. 16/215,462, filed on Dec. 10, 2018, which claims priority from and the benefit of Korean Patent Application No. 10-2018-0011360, filed on Jan. 30, 2018, each of which is hereby incorporated by reference for all purposes as if fully set forth herein.

BACKGROUND

Field

One or more exemplary embodiments relate to a display device.

Discussion of the Background

In general, display devices may be used in mobile devices, such as smartphones, laptop computers, digital cameras, camcorders, portable information terminals, notebook computers, or tablet personal computers, or may be used in electronic devices, such as desktop computers, televisions, outdoor advertisement boards, display devices for exhibitions, dashboards for vehicles, or head-up displays (HUDs).

Recently, slimmer display devices have been released.

Flexible display devices may be applied to portable apparatuses having various shapes. Among them, flexible display devices based on organic light-emitting display technology have gained much attention. A flexible display device may be bent in one direction.

However, the display devices have high reflectance due to the reflection from wiring lines, metal electrodes, or the like arranged on a substrate, and have limitations in realizing black color.

The display devices may include a sensor having various functions.

The above information disclosed in this Background section is only for understanding of the background of the inventive concepts, and, therefore, it may contain information that does not constitute prior art.

SUMMARY

One or more exemplary embodiments relate to a display device having low reflectance while easily recognizing an input object.

Additional features of the inventive concepts will be set forth in the description which follows, and in part will be apparent from the description, or may be learned by practice of the inventive concepts.

According to one or more exemplary embodiments, a display device includes: a substrate on which a plurality of sub-pixels are arranged; a light-emitting device including a light-emitting layer in each of the plurality of sub-pixels; a thin film encapsulation layer covering the light-emitting layer in each of the plurality of sub-pixels; a black matrix around the plurality of sub-pixels; and an optical sensor on the substrate, the optical sensor including a sensing portion for sensing light emitted from a light source, wherein the black matrix has a plurality of openings, through which light emitted from the light source passes, in a path through which the light is received by the sensing portion via an input object which is in contact with a layer over the substrate.

The black matrix may be on the thin film encapsulation layer and may cover a non-light-emitting area between adjacent sub-pixels.

The sensing portion may be under the black matrix and may be at a corresponding location in the non-light-emitting area that receives the light passing through the plurality of openings.

An overcoating layer may cover the black matrix, wherein the plurality of openings may be filled with a material for the overcoating layer.

The black matrix may include a first black matrix and a second black matrix in different layers in a direction perpendicular to the substrate.

The overcoating layer may include a first overcoating layer and a second overcoating layer, wherein the first black matrix may have a plurality of first openings spaced apart from each other and may be covered by the first overcoating layer, wherein the second black matrix may be on the first overcoating layer, have a plurality of second openings spaced apart from each other, and be covered by the second overcoating layer.

The plurality of second openings at least partially may overlap the plurality of first openings in the direction perpendicular to the substrate.

Each of the plurality of first openings and each of the plurality of second openings, which correspond to each other, may be arranged to be misaligned from each other so that light having an inclination angle with respect to the direction perpendicular to the substrate passes through the first and second openings.

The black matrix may include a first black matrix and a second black matrix in the same layer in a direction perpendicular to the substrate.

The plurality of sub-pixels may include a red sub-pixel, a green sub-pixel, and a blue sub-pixel, wherein the first black matrix may be in a non-light-emitting area around the red sub-pixel and the green sub-pixel and have a plurality of first openings spaced apart from each other, the second black matrix may be in a non-light-emitting area around the blue sub-pixel, and the first black matrix and the second black matrix may be covered by the overcoating layer.

The black matrix may include an inclined surface surrounding each of the plurality of openings so that light having an inclination angle with respect to a direction perpendicular to the substrate passes through the plurality of openings.

The light source may be separately provided on the substrate and may be in a non-light-emitting area between adjacent sub-pixels.

The light source may include an infrared light-emitting device.

The plurality of openings may be further on the light source.

The light source may include a light-emitting device including at least one of light-emitting layers arranged in the plurality of sub-pixels.

The black matrix may include a black polymer material having an optical density of 1.0 or more.

According to one or more exemplary embodiments, a display device includes: a substrate having a display area, in which a plurality of sub-pixels are arranged, and a non-display area extending from the display area; a thin film encapsulation layer covering the display area; a black matrix in a non-light-emitting area between adjacent sub-pixels; and an optical sensor under the black matrix, the optical sensor including a sensing portion for sensing light emitted from a light source, wherein the black matrix has a plurality of openings, through which light emitted from the light source passes, in a path through which the light is received by the sensing portion via an input object which is in contact with a layer over the substrate.

The black matrix may be on the thin film encapsulation layer, wherein the sensing portion may be in a non-light-emitting area between adjacent sub-pixels.

The light source may be separately provided on the substrate and may be in a non-light-emitting area between adjacent sub-pixels, wherein the plurality of openings may be further on the light source.

The light source may include a light-emitting device including at least one of light-emitting layers arranged in the plurality of sub-pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
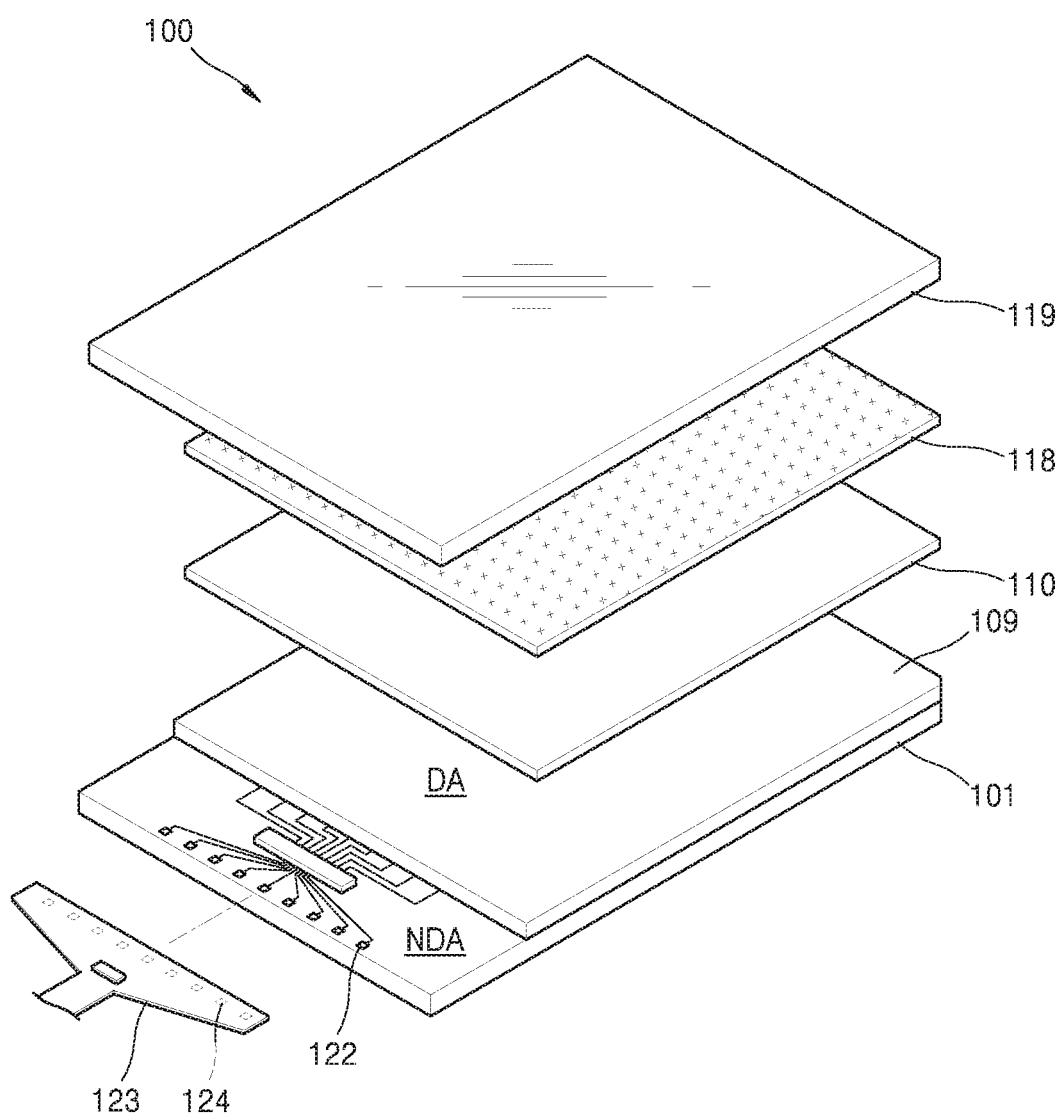
FIG. 1 is a perspective view of a display device according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the typical x, y, and z-axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
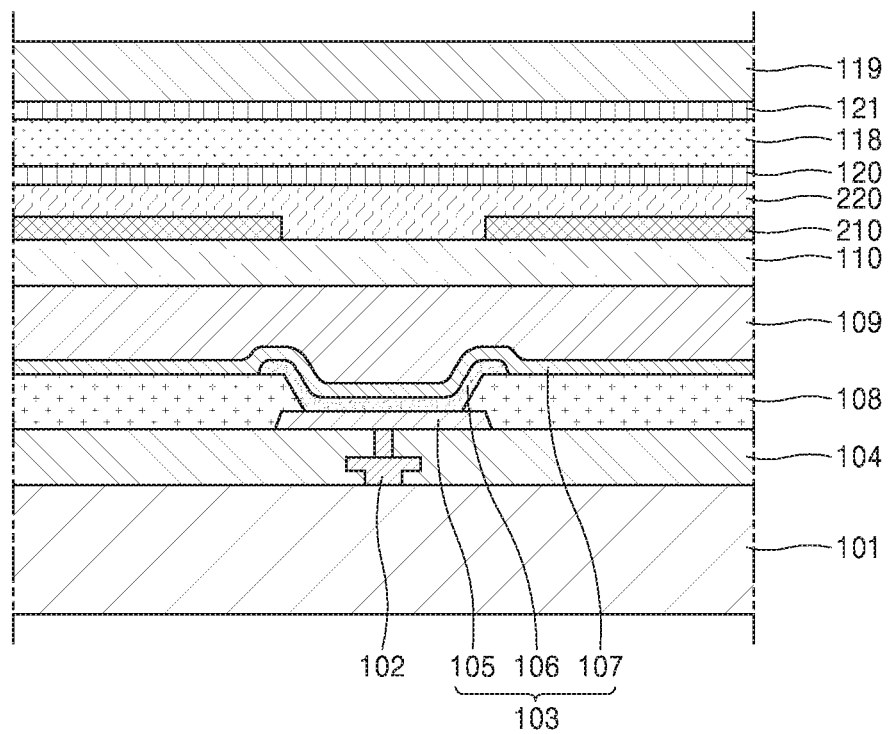
FIG. 2 is a cross-sectional view illustrating a sub-pixel in FIG. 1.
Figure 3:
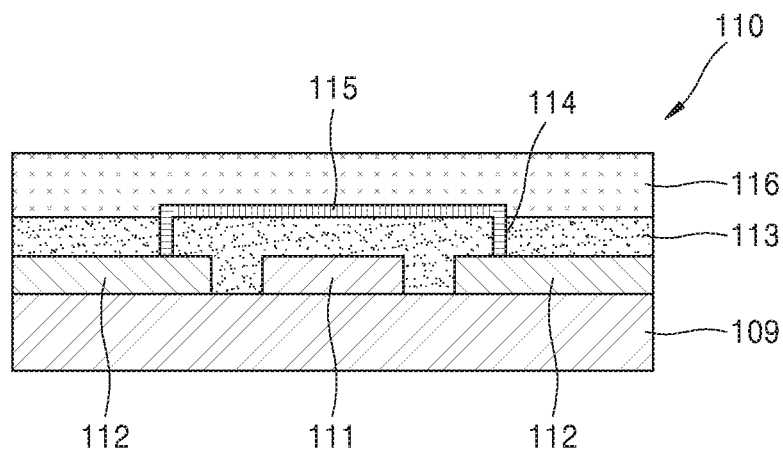
FIG. 3 is a cross-sectional view illustrating a touch sensing unit in FIG. 1.
Figure 4:
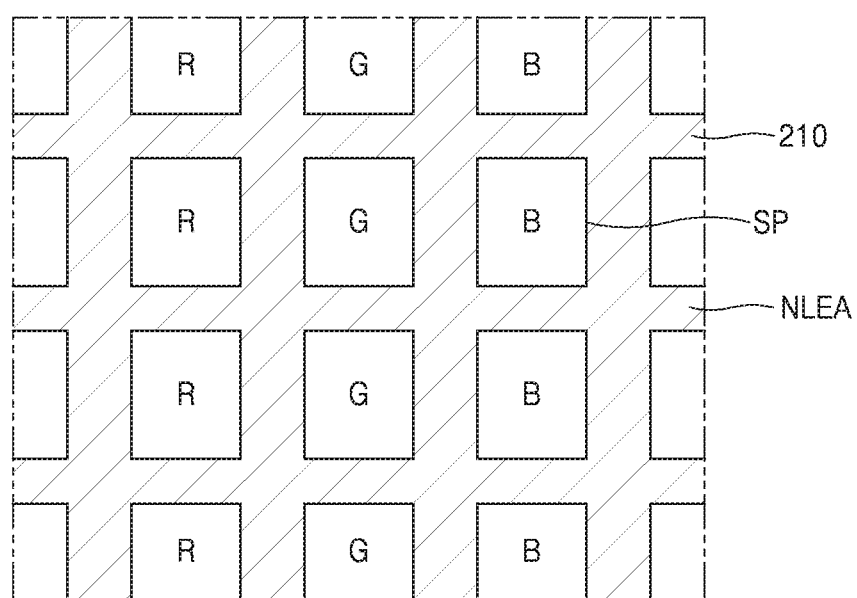
FIG. 4 is a plan view illustrating the arrangement of a black matrix in FIG. 2.

FIG. 1 is a perspective view of a display device 100 according to an exemplary embodiment, FIG. 2 is a cross-sectional view illustrating a sub-pixel SP in FIG. 1, FIG. 3 is a cross-sectional view illustrating a touch sensing unit 110 in FIG. 1, and FIG. 4 is a plan view illustrating the arrangement of a black matrix 210 in FIG. 2.

In an exemplary embodiment, the display device 100 may be an organic light-emitting display. In another exemplary embodiment, the display device 100 may be a liquid crystal display, a field emission display, or an electronic paper display. However, the display device 100 is not limited thereto.

Referring to FIGS. 1 to 4, the display device 100 includes a substrate 101 having a display area DA for displaying an image and a non-display area NDA extending outward from the display area DA. The substrate 101 may be a glass substrate, a polymer substrate, or a flexible film. The substrate 101 may be transparent, opaque, or translucent. The substrate 101 may be flexible.

A thin film transistor 102 and a light-emitting device 103 electrically connected to the thin film transistor 102 may be arranged on the substrate 101. Although not shown, the thin film transistor 102 includes elements such as a semiconductor layer, a gate electrode, a source electrode, and a drain electrode. Insulating layers may be arranged between the elements to insulate the elements from each other.

A protective film 104 may be arranged on the thin film transistor 102. The protective film 104 may cover the thin film transistor 102. The protective film 104 may include any one of a passivation film and a planarization film. The protective film 104 may be a single layer film or a multilayer film. The protective film 104 may include an organic material. In another embodiment, the protective film 104 may have a structure in which an inorganic insulating film and an organic insulating film are stacked.

The light-emitting device 103 may be an organic light-emitting device including a first electrode 105, a second electrode 107, and an intermediate layer 106 between the first electrode 105 and the second electrode 107.

The first electrode 105 may be electrically connected to the thin film transistor 102. The first electrode 105 may have various shapes. For example, the first electrode 105 may be patterned in an island shape.

The first electrode 105 may serve as an anode and may include any of various conductive materials. The first electrode 105 may be a reflective electrode. For example, the first electrode 105 may include a reflective film including Ag, Mg, Al, Pt, Pd, Au, Ni, Nd, Ir, Cr, or a compound thereof and a transparent electrode or translucent electrode positioned on the reflective film. The transparent electrode or the translucent electrode may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second electrode 107 may be a transparent electrode or a translucent electrode. For example, the second electrode 107 may include a metal thin film having a low work function, which includes Li, Ca, LiF/Ca, LiF/Al, Al, Ag, Mg, or a compound thereof. In another embodiment, the second electrode 107 may include an auxiliary electrode or bus electrode including a transparent electrode forming material such as ITO, IZO, ZnO, or $In_2O_3$ on a metal thin film.

A pixel-defining layer 108 may be positioned on the first electrode 105. The pixel-defining layer 108 defines a light-emitting region of each sub-pixel SP by surrounding the edge of the first electrode 105. The pixel-defining layer 108 includes an organic material. The pixel-defining layer 108 may expose a portion of the first electrode 105, and the intermediate layer 106 including a light-emitting layer may be located in the exposed portion of the first electrode 105.

The light-emitting layer provided in the intermediate layer 106 may include a low molecular weight organic material or a high molecular weight organic material. The intermediate layer 106 may further include a functional layer, such as a hole transport layer (HTL), a hole injection layer (HIL), an electron transport layer (ETL), or an electron injection layer (EIL), in addition to the light-emitting layer. The light-emitting layer provided in the intermediate layer 106 may be positioned in each of a plurality of sub-pixels SP arranged in the display area DA.

A thin film encapsulation (TFE) layer 109 may be positioned on the substrate 101. The TFE layer 109 may seal the display area DA in which the plurality of sub-pixels SP are arranged. The TFE layer 109 may prevent outside air and moisture from penetrating into the display area DA. The TFE layer 109 includes at least one inorganic film and at least one organic film.

The touch sensing unit 110 may be positioned on the TFE layer 109. The touch sensing unit 110 may be an on-cell touch screen panel having a touch screen pattern positioned on the TFE layer 109. The touch sensing unit 110 may be integrally formed on the TFE layer 109, but is not limited thereto. In an exemplary embodiment, the touch sensing unit 110 may be an electrostatic capacitive type touch sensing unit. However, the touch sensing unit 110 is not limited thereto.

The touch sensing unit 110 includes a plurality of first electrode pattern portions 111 and a plurality of second electrode pattern portions 112, patterned on the TFE layer 109. In another embodiment, the plurality of first electrode pattern portions 111 and the plurality of second electrode pattern portions 112 may be patterned on a separate touch substrate. The plurality of first electrode pattern portions 111 and the plurality of second electrode pattern portions 112 may be arranged to cross each other.

An insulating layer 113 may be positioned on the first and second electrode pattern portions 111 and 112. The insulating layer 113 may cover the first and second electrode pattern portions 111 and 112. Adjacent second electrode pattern portions 112 may be connected to each other by a connection portion 115 positioned in a contact hole 114. Although not shown, adjacent first electrode pattern portions 111 may be connected to each other by a separate connection portion. In an exemplary embodiment, the first and second electrode pattern portions 111 and 112 are arranged in the same layer. However, the first and second electrode pattern portions 111 and 112 may be arranged in different layers.

A protective layer 116 may be positioned on the insulating layer 113.

When an input object such as a finger or a stylus pen approaches or comes into contact with the display device 100 of FIG. 1, a touch position may be detected by measuring a capacitance change between the first electrode pattern portions 111 and the second electrode pattern portions 112.

A black matrix 210 may be positioned on the touch sensing unit 110. The black matrix 210 may be positioned around the sub-pixels SP. The black matrix 210 may be covered by an overcoating layer 220.

A polarizing layer 118 may be positioned on the overcoating layer 220. The polarizing layer 118 prevents external light from being reflected from the display area DA. When the polarizing layer 118 is film-shaped, a first adhesive 120 for bonding the polarizing layer 118 to the overcoating layer 220 may be between the polarizing layer 118 and the overcoating layer 220. In another exemplary embodiment, when the polarizing layer 118 is formed by a deposition process, the first adhesive 120 may be omitted.

A window cover 119 may be positioned on the polarizing layer 118 to protect the display device 100. A second adhesive 121 for bonding the polarizing layer 118 to the window cover 119 may be between the polarizing layer 118 and the window cover 119.

A plurality of pads 122 may be positioned in the non-display area NDA extending along one edge region of the substrate 101. Terminals 124 of a circuit board 123 may be respectively connected to the plurality of pads 122 to receive electrical signals from the outside. The circuit board 123 may be a flexible printed circuit board (FPCB) having flexible properties.

Optical characteristics of the display device 100 may deteriorate due to the reflection from metal materials, such as wiring lines connected to electrodes provided in the thin film transistor 102 and the first and second electrodes 105 and 107 provided in the light-emitting device 103.

The black matrix 210 may be provided above the substrate 101 to improve the optical characteristics of the display device 100. In an exemplary embodiment, the black matrix 210 may be positioned on the touch sensing unit 110. In another embodiment, the black matrix 210 may be positioned between the TFE layer 109 and the touch sensing unit 110. Although the black matrix 210 is located on the TFE layer 109, the present disclosure is not limited thereto.

The black matrix 210 may cover a non-light-emitting area NLEA between adjacent sub-pixels SP. The non-light-emitting area NLEA may correspond to an area between the adjacent sub-pixels SP, in which a plurality of light-emitting layers such as a red light-emitting layer R, a green light-emitting layer G, and a blue light-emitting layer B are arranged. The black matrix 210 may entirely cover the non-light-emitting area NLEA between the adjacent sub-pixels SP.

As the black matrix 210 is positioned in the non-light-emitting area NLEA, reflection from wiring lines or electrodes arranged in a lower portion of the display device 100 may be reduced and transmission of external light may also be suppressed. The opening area of the black matrix 210 may be equal to the emission area of the sub-pixel SP.

In another exemplary embodiment, the opening area of the black matrix 210 may be different from the emission area of the sub-pixel SP. Specifically, when the opening area of the black matrix 210 is equal to the emission area of the sub-pixel SP, lateral visibility and a color shift of side light, for example, white angular dependency (WAD), may deteriorate. Therefore, the opening area of the black matrix 210 may be greater than the emission area of the sub-pixel SP.

The black matrix 210 includes a black polymer material having an optical density (OD) of 1.0 or more (OD≥1.0) to suppress reflection from wiring lines and electrodes as much as possible. The black matrix 210 may include a low temperature curable material of 90° C. or less to prevent thermal degradation of a red light-emitting layer R, a green light-emitting layer G, and a blue light-emitting layer B.

The overcoating layer 220 may cover the black matrix 210. The overcoating layer 220 may completely cover the black matrix 210 in the non-light-emitting area NLEA between the adjacent sub-pixels SP. The overcoating layer 220 may eliminate a step caused by the black matrix 210 and may provide a flat surface.

The overcoating layer 220 may include a material having high transmittance. In an exemplary embodiment, the overcoating layer 220 includes acrylic, epoxy, or cardo-based polymer. The overcoating layer 220 may include a low temperature curable material of 90° C. or less to prevent thermal degradation of light-emitting layers.

As described above, the display device 100 employing the black matrix 210 may lower the reflectance of the wiring lines and the electrodes, thereby improving optical characteristics.

The display device 100 may include a sensor having various functions. For example, the display device 100 may include at least one sensor for sensing information in an electronic device, user information, and the like.

Figure 5:
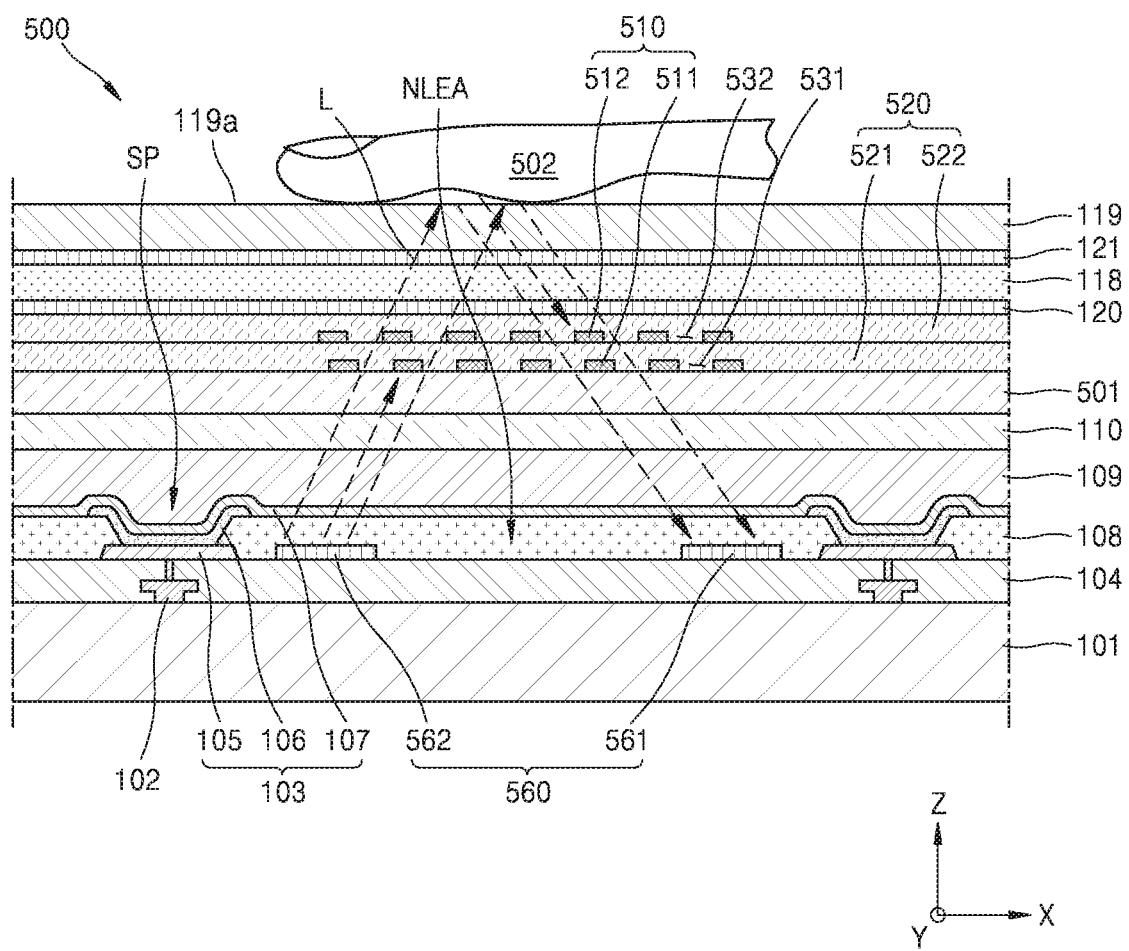
FIG. 5 is a cross-sectional view illustrating a display device having an optical sensor according to an exemplary embodiment.

FIG. 5 is a cross-sectional view illustrating a display device 500 having an optical sensor 560 according to an exemplary embodiment.

Referring to FIG. 5, a TFE layer 109 may be positioned on a substrate 101. The TFE layer 109 may cover a light-emitting device 103, for example, an organic light-emitting device. A touch sensing unit 110 may be positioned on the TFE layer 109. Electrode patterns included in the touch sensing unit 110 may be formed directly on the TFE layer 109 by a deposition process. In another exemplary embodiment, the touch sensing unit 110 may have a film shape and may be attached to the upper surface of the TFE layer 109 by using an adhesive.

An insulating layer 501 may be positioned on the touch sensing unit 110. The insulating layer 501 may include an organic material. The insulating layer 501 may planarize the surface of the touch sensing unit 110. When the surface of the touch sensing unit 110 is flat, the insulating layer 501 may be omitted.

A black matrix 510 may be positioned on the insulating layer 501 to improve optical characteristics of the display device 500. The black matrix 510 may be covered by an overcoating layer 520. The main features of the black matrix 510 will be described in detail later.

A polarizing layer 118 may be positioned on the overcoating layer 520. The polarizing layer 118 may be of a film type. A first adhesive 120 may be between the polarizing layer 118 and the overcoating layer 520.

A window cover 119 may be positioned on the polarizing layer 118. The window cover 119 may include glass or polymer. A second adhesive 121 may be between the polarizing layer 118 and the window cover 119.

An optical sensor 560 for sensing information may be provided on the substrate 101. According to the present embodiment, a case in which the optical sensor 560 is a fingerprint recognition sensor for recognizing a fingerprint of a user is described as an example. However, the present embodiment is not limited thereto and the optical sensor 560 may be any of optical sensors capable of sensing light and acquiring information in an electronic device or user information.

An optical sensor 560 capable of sensing an input provided by an input object 502 contacting a surface 119a of the window cover 119, which is the top surface of the display device 500, may be provided on the substrate 101. In an exemplary embodiment, the input object 502 may be a finger and the optical sensor 560 may be a sensor capable of detecting a fingerprint characteristic of the input object 502.

The optical sensor 560 includes a sensing portion 561 capable of sensing light L that is emitted from a light source 562 and passes through the input object 502. Specifically, the sensing portion 561 may sense the light L that is emitted from the light source 562 and passes through the lower surface of the input object 502 that is in contact with the surface 119a of the window cover 119.

The sensing portion 561 may be positioned in a non-light-emitting area NLEA between adjacent sub-pixels SP. A plurality of sensing portions 561 may be positioned in the non-light-emitting area NLEA. The sensing portion 561 may be located on a protective film 104. In another embodiment, the sensing portion 561 may be located on any one of insulating layers that insulate elements included in the thin film transistor 102, but is not limited thereto.

The sensing portion 561 may be an element capable of sensing the light L reflected from the input object 502, for example, a thin film transistor or thin film diode having a predetermined pattern. In an exemplary embodiment, the sensing portion 561 may be any of optical sensors capable of sensing the light L reflected from the input object 502, but is not limited thereto.

The light source 562 for emitting light L may be separately positioned on the substrate 101. The light source 562 includes an infrared light-emitting device capable of emitting light L onto the surface 119a of the window cover 119, which is a sensing surface on which the input object 502 contacts. The light source 562 may be any of light-emitting devices capable of emitting light L toward the input object 502. For example, the light-emitting device 103 including an intermediate layer 106 positioned in each sub-pixel SP may be used as a light source.

The light source 562 may be positioned in the non-light-emitting area NLEA between the adjacent sub-pixels SP. A plurality of light sources 562 may be positioned in the non-light-emitting area NLEA. The light source 562 and the sensing portion 561 may be located on the same layer, i.e., on the protective film 104. In another embodiment, the light source 562 and the sensing portion 561 may be located on different insulating layers.

In this case, a black matrix 510 may be positioned in the non-light-emitting area NLEA between the adjacent sub-pixels SP to improve optical characteristics of the display device 100. The light L, which is emitted from the light source 562 and received by the sensing portion 561 via the input object 502, may be blocked by the black matrix 510.

In order to prevent the blocking of the light L, the black matrix 510 may have a plurality of openings, for example, first and second openings 531 and 532, through which the light L emitted from the light source 562 passes, in a path through which the light L is received by the sensing portion 561 via the input object 502 which is in contact with the surface 119a of the window cover 119.

Specifically, the black matrix 510 includes a first black matrix 511 and a second black matrix 512 arranged in different layers in a direction (Z direction) perpendicular to the substrate 101. The overcoating layer 520 includes a first overcoating layer 521 covering the first black matrix 511 and a second overcoating layer 522 covering the second black matrix 512.

The first black matrix 511 may be positioned on the insulating layer 501. A plurality of first openings 531 may be formed in the first black matrix 511. The first overcoating layer 521 may cover the first black matrix 511. The plurality of first openings 531 may be filled with a material for the first overcoating layer 521.

The second black matrix 512 may be positioned on the first overcoating layer 521. A plurality of second openings 532 may be formed in the second black matrix 512. The second overcoating layer 522 may cover the second black matrix 512. The plurality of second openings 532 may be filled with a material for the second overcoating layer 522.

The second openings 532 may at least partially overlap the first openings 531 in the direction (Z direction) perpendicular to the substrate 101. As the number of first and second openings 531 and 532 increases, the reflectance of the display device 500 may increase due to wiring lines, metal electrodes, or the like. As a result, optical characteristics of the display device 100 may deteriorate. Thus, in order to lower the reflectance, the second openings 532 may at least partially overlap the first openings 531.

More specifically, the first openings 531 penetrate the first black matrix 511 and may be spaced apart from each other by a predetermined distance. The second openings 532 penetrate the second black matrix 512 and may be spaced apart from each other by a predetermined distance. Each of the first openings 531 and each of the second openings 532, which correspond to each other in the direction (Z direction) perpendicular to the substrate 101, may at least partially overlap each other. Each of the first openings 531 and each of the second openings 532, which correspond to each other, may be arranged to be misaligned from each other so that the light L emitted from the light source 562 is reflected from the input object 502 and passes through the first openings 531 and the second openings 532 in succession with a certain inclination angle. The light L passing through the first openings 531 and the second openings 532 may be sidelight.

The sensing portion 561 may be located at a corresponding location in the non-light-emitting area NLEA receiving the light L passing through the first openings 531 and the second openings 532. The first openings 531 and the second openings 532 are also positioned on the light source 562.

In an exemplary embodiment, the reflectance due to side external light may be lowered because the second openings 532 partially overlap the first openings 531.

In an exemplary embodiment, the first openings 531 formed in the first black matrix 511 and the second openings 532 formed in the second black matrix 512 may be patterned by using a mask or by a photo process.

The operation of the optical sensor 560 will be described below.

The light L emitted from the light source 562 passes through the first openings 531 and the second openings 532 and reaches the input object 502 that is in contact with the surface 119a of the window cover 119, which is a sensing surface. In this case, a part of the light L is absorbed by the first black matrix 511 and the second black matrix 512.

The light L impinging on the input object 502 is reflected from the input object 502 at various intensities. The light L reflected from the input object 502 passes through the first openings 531 and the second openings 532 in succession. The light L having an angle of inclination, which has passed through the first openings 531 and the second openings 532, reaches the sensing portion 561. The sensing portion 561 may detect a fingerprint characteristic of the input object 502 according to light intensity. In this case, the amount of light reaching the sensing portion 561 may be limited by an interval formed by the first openings 531 and the second openings 532 at least partially overlapping each other.

Figure 6:
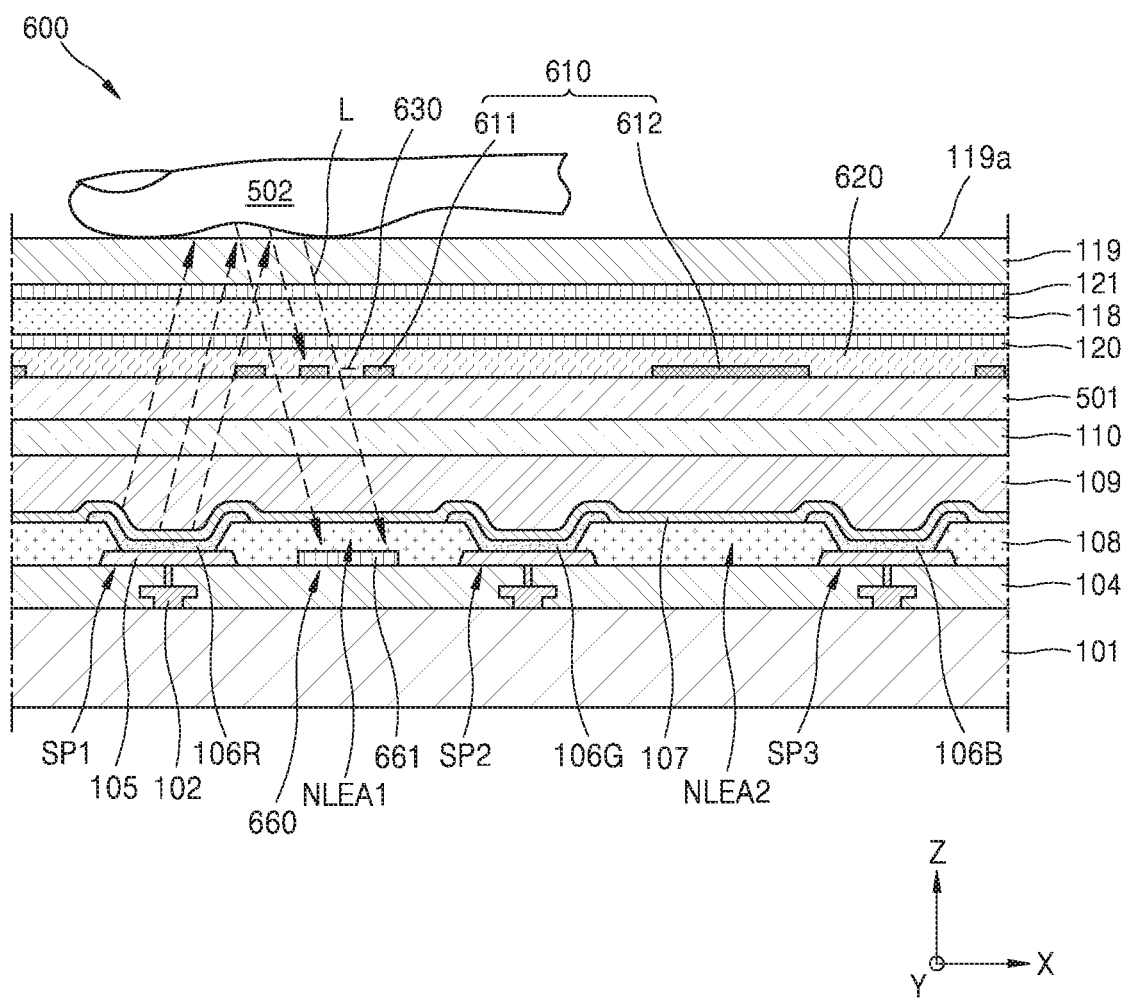
FIG. 6 is a cross-sectional view illustrating a display device having an optical sensor according to another exemplary embodiment of the present disclosure.

FIG. 6 is a cross-sectional view illustrating a display device 600 having an optical sensor 660 according to another embodiment of the present disclosure.

Referring to FIG. 6, a red sub-pixel SP1, a green sub-pixel SP2, and a blue sub-pixel SP3 may be positioned on the substrate 101. The red sub-pixel SP1, the green sub-pixel SP2, and the blue sub-pixel SP3 may be alternately arranged on the substrate 101. A red light-emitting layer 106R, a green light-emitting layer 106G, and a blue light-emitting layer 106B may be positioned in the red sub-pixel SP1, the green sub-pixel SP2, and the blue sub-pixel SP3, respectively.

The optical sensor 660 may be provided on the substrate 101. The optical sensor 660 includes a sensing portion 661 that may sense light L reflected from an input object 502. The sensing portion 661 may be positioned in a non-light-emitting area NLEA1 between adjacent sub-pixels, i.e., the red sub-pixel SP1 and the green sub-pixel SP2. The sensing portion 661 may be a patterned thin film transistor or thin film diode.

A separate light source may not be provided on the substrate 101. More specifically, at least one of the red sub-pixel SP1, the green sub-pixel SP2, and the blue sub-pixel SP3 positioned on the substrate 101 may be used as a light source.

Specifically, the red light-emitting layer 106R positioned in the red sub-pixel SP1 and the green light-emitting layer 106G positioned in the green sub-pixel SP2 may be used as a light source. On the other hand, the blue sub-pixel SP3 is not used as a light source. This is because the blue light-emitting layer 106B positioned in the blue sub-pixel SP3 has a wavelength band that is not available as a light source. Light L emitted from the red sub-pixel SP1 and the green sub-pixel SP2 may be irradiated to the lower surface of the input object 502, which is in contact with a surface 119a of a window cover 119.

The sensing portion 661 may be positioned in the non-light-emitting area NLEA1 around the red sub-pixel SP1 and the green sub-pixel SP2 but may not be positioned in a non-light-emitting area NLEA2 around the blue sub-pixel SP3.

In this case, a black matrix 610 may be positioned on an insulating layer 501 to improve optical characteristics of the display device 600. The black matrix 610 may cover the non-light-emitting areas NLEA1 and NLEA2 between the red sub-pixel SP1, the green sub-pixel SP2, and the blue sub-pixel SP3, arranged adjacent to each other.

The light L, which is emitted from the red light-emitting layer 106R positioned in the red sub-pixel SP1 and the green light-emitting layer 106G positioned in the green sub-pixel SP2 and is received by the sensing portion 661 via the input object 502, may be blocked by the black matrix 610.

In order to prevent the blocking of the light L, the black matrix 610 may have first openings 630, through which the light L emitted from the red sub-pixel SP1 and the green sub-pixel SP2 passes, in a path through which the light L is received by the sensing portion 661 via the input object 502 which is in contact with the surface 119a of the window cover 119.

Specifically, the black matrix 610 includes a first black matrix 611 and a second black matrix 612 arranged in the same layer in a direction (X direction) parallel to the substrate 101. The first black matrix 611 and the second black matrix 612 may be covered by an overcoating layer 620.

The first black matrix 611 may be positioned in the non-light-emitting area NLEA1 around the red sub-pixel SP1 and the green sub-pixel SP2. The second black matrix 612 may be positioned in the non-light-emitting area NLEA2 around the blue sub-pixel SP3.

The first black matrix 611 and the second black matrix 612 may be positioned on the insulating layer 501. A plurality of first openings 630 may be formed in the first black matrix 611. The plurality of first openings 630 may be spaced apart from each other. The plurality of first openings 630 may be filled with a material for the overcoating layer 620.

On the other hand, the second black matrix 612 is of a solid type, and unlike the first black matrix 611, a plurality of openings are not formed in the second black matrix 612.

Hereinafter, the operation of the optical sensor 660 will be described.

The light L emitted from the red sub-pixel SP1 and the green sub-pixel SP2 corresponding to a light source reaches the input object 502 which is in contact with the surface 119a of the window cover 119, which is a sensing surface. The light L impinging on the input object 502 is reflected from the input object 502 at various intensities. The light L reflected from the input object 502 passes through the first openings 630. The light L having passed through the first openings 630 reaches the sensing portion 661. The sensing portion 661 may detect a fingerprint characteristic of the input object 502 according to light intensity.

Figure 7:
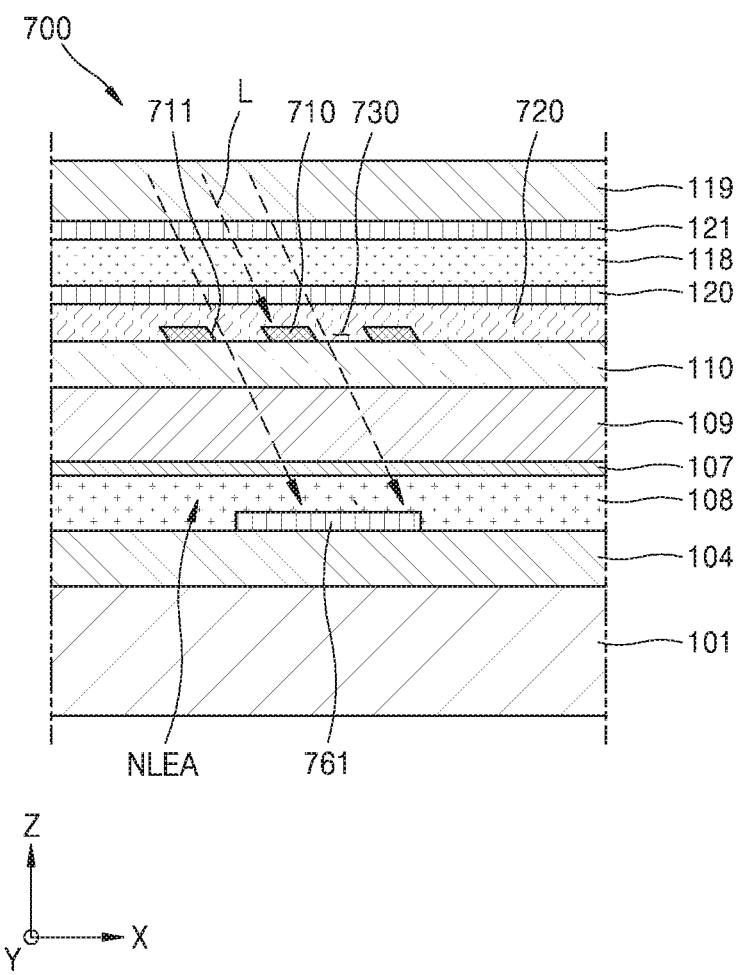
FIG. 7 is a cross-sectional view illustrating a display device having a black matrix according to an exemplary embodiment.

FIG. 7 is a cross-sectional view illustrating a display device 700 having a black matrix 710 according to an exemplary embodiment.

Referring to FIG. 7, a sensing portion 761 may be positioned on a substrate 101. The sensing portion 761 may be positioned in a non-light-emitting area NLEA between adjacent sub-pixels. The sensing portion 761 may be a patterned thin film transistor or thin film diode. Although not shown in FIG. 7, a light source may be a light-emitting layer positioned in a sub-pixel, or a separately prepared light-emitting device.

A black matrix 710 may be positioned on a touch sensing unit 110. In another embodiment, an insulating layer may be additionally positioned on the touch sensing unit 110 to provide a flat surface.

A plurality of first openings 730 may be formed in the black matrix 710. An overcoating layer 720 may cover the black matrix 710. The plurality of first openings 730 may be filled with a material for the overcoating layer 720. The plurality of first openings 730 may be spaced apart from each other.

The black matrix 710 may have an inclined surface 711 surrounding each of the plurality of first openings 730 so that light L having an inclination angle with respect to a direction (Z direction) perpendicular to the substrate 101 passes through the plurality of first openings 730. In an exemplary embodiment, the inclined surface 711 may be inclined along the path of the light L having an inclination angle, which passes through the plurality of first openings 730. For example, an inclined surface of a black matrix (not shown) located above a separately provided light source may be opposite to the inclined surface 711 of the black matrix 710 located above the sensing portion 761.

In an exemplary embodiment, the inclined surface 711 of the black matrix 710 may have an inclination angle that is equal to or greater than 45 degrees. Thus, the reflectance due to side external light may be reduced.

As described above, the display device of the present disclosure may easily recognize an input object and may also lower the reflectance.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
 a substrate;
 a plurality of sub-pixels arranged on the substrate;
 a light-emitting device comprising a light-emitting layer disposed in each of the plurality of sub-pixels;
 a thin film encapsulation layer covering the light-emitting layer in each of the plurality of sub-pixels;
 a black matrix disposed around the plurality of sub-pixels; and
 an optical sensor disposed on the substrate, the optical sensor comprising a sensing portion for sensing light emitted from a light source,
 wherein the black matrix comprises a plurality of openings, through which light emitted from the light source passes, in a path through which the light is received by the sensing portion via an input object which is in contact with a layer over the substrate,
 wherein the light source comprises a light-emitting device comprising at least one of light-emitting layers arranged in the plurality of sub-pixels, and
 wherein the black matrix comprises a first black matrix and a second black matrix in the same layer and spaced apart from each other in a direction parallel to the substrate, the first black matrix having the plurality of openings and being arranged in an area between the light-emitting device and an adjacent light emitting device comprising at least one of light-emitting layers.

2. The display device of claim 1, wherein the black matrix is disposed on the thin film encapsulation layer and covers a non-light-emitting area between adjacent sub-pixels.

3. The display device of claim 2, wherein the sensing portion is disposed under the black matrix and is at a corresponding location in the non-light-emitting area that receives the light passing through the plurality of openings.

4. The display device of claim 1, wherein an overcoating layer covers the black matrix,
 wherein the plurality of openings are filled with a material of the overcoating layer.

5. The display device of claim 1, wherein the plurality of sub-pixels comprise a red sub-pixel, a green sub-pixel, and a blue sub-pixel,
 wherein the first black matrix is disposed in a non-light-emitting area around the red sub-pixel and the green sub-pixel, the second black matrix is disposed in a non-light-emitting area around the blue sub-pixel, and the first black matrix and the second black matrix are covered by the overcoating layer.

6. The display device of claim 1, wherein the black matrix comprises a black polymer material having an optical density of 1.0 or more.

7. A display device comprising:
 a substrate having a display area, in which a plurality of sub-pixels are arranged, and a non-display area extending from the display area;
 a thin film encapsulation layer covering the display area;
 a black matrix in a non-light-emitting area between adjacent sub-pixels; and
 an optical sensor under the black matrix, the optical sensor comprising a sensing portion for sensing light emitted from a light source,
 wherein the black matrix comprises a plurality of openings, through which light emitted from the light source passes, in a path through which the light is received by the sensing portion via an input object which is in contact with a layer over the substrate,
 wherein the light source comprises a light-emitting device comprising at least one of light-emitting layers arranged in the plurality of sub-pixels, and
 wherein the black matrix comprises a first black matrix having the plurality of openings and a second black matrix in the same layer and spaced apart from each other in a direction parallel to the substrate, the first black matrix being arranged in an area between the light-emitting device and an adjacent light emitting device comprising the light-emitting layer and an adjacent light emitting device comprising at least one of light-emitting layers.

8. The display device of claim 7, wherein the black matrix is disposed on the thin film encapsulation layer,
 wherein the sensing portion is disposed in the non-light-emitting area between adjacent sub-pixels.

* * * * *